(12) United States Patent
Ishida et al.

(10) Patent No.: US 6,734,727 B2
(45) Date of Patent: May 11, 2004

(54) FEEDFORWARD AMPLIFIER, FEEDFORWARD AMPLIFICATION METHOD

(75) Inventors: Kaoru Ishida, Shijonawate (JP); Naoki Takachi, Yokohama (JP); Yuji Saito, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/225,222

(22) Filed: Aug. 21, 2002

(65) Prior Publication Data

US 2003/0058042 A1 Mar. 27, 2003

(30) Foreign Application Priority Data

Aug. 21, 2001 (JP) ........................................ 2001-250818

(51) Int. Cl.$^7$ ................................................ H03F 3/66
(52) U.S. Cl. ............................................ 330/52; 330/151
(58) Field of Search ................... 330/52, 151, 149, 330/136; 327/560

(56) References Cited

U.S. PATENT DOCUMENTS

| | | | | |
|---|---|---|---|---|
| 5,489,875 A | * | 2/1996 | Cavers | 330/151 |
| 6,232,837 B1 | * | 5/2001 | Yoo et al. | 330/151 |
| 6,366,620 B1 | * | 4/2002 | Jackson et al. | 375/308 |
| 6,388,515 B1 | * | 5/2002 | Nishida | 330/52 |
| 6,456,160 B1 | * | 9/2002 | Nakayama et al. | 330/52 |

FOREIGN PATENT DOCUMENTS

JP 08-56126 2/1996

OTHER PUBLICATIONS

Walker, "High–Power GaAs FET Amplifiers", Artech House, 1993, pp. 332–333.
Pothecary, "Feedforward Linear Power Amplifiers", Artech House, 1999, pp. 73–76.

* cited by examiner

*Primary Examiner*—Dinh Thanh Le
(74) *Attorney, Agent, or Firm*—RatnerPrestia (57) ABSTRACT

A feedforward amplifier includes a main amplifier for amplifying an input signal, a control circuit for generating a predetermined pilot signal based on the output of a local oscillator and a frequency divider included in the control circuit, and a coupler for combining the input signal or the amplified signal with the pilot signal to generate a combined signal. A first coupler and a second coupler are provided for extracting any distortion component from the combined signal. A vector adjuster, an error amplifier, and a third coupler are provided for removing the extracted distortion component from the combined signal to generate an output signal. An orthogonal detector is provided for using any one of the pilot signal, or the output of the local oscillator, the frequency divider, and the combination of the vector adjuster, error amplifier, and the third coupler to make an adjustment for removing the distortion component.

21 Claims, 3 Drawing Sheets

FEEDFORWARD AMPLIFIER, FEEDFORWARD AMPLIFICATION METHOD

BACKGROUND OF THE INVENTION

1. Field of the Invention

The present invention relates to a feedforward amplifier and a feedforward amplification method used for a base station apparatus of mobile communication equipment and so on.

2. Related Art of the Invention

In recent years, a power amplifier of high efficiency and high linearity is required for a transmitter of a base station of mobile communication equipment in order to amplify a large number of signaling channels by one operation, and improvement in the linearity is implemented by performing distortion compensation by a feedforward method.

A feedforward amplifier will not be described in detail here since it is also described in John L. B. Walker, "High-Power GaAs FET Amplifiers," Artech House, 1993, pp. 332 to 333, for instance. Moreover, the entire disclosure of this literature are incorporated herein by reference in its entity.

And in recent years, a CDMA (Code Division Multiple Access) method of a broad band is adopted as a modulation method of a portable telephone, so that the base station also requires broad-band transmission, and broad-band distortion compensation control is also required for feedforward distortion compensation. Moreover, the CDMA method will not be described in detail here since it is also described in Nick Pothecary, "Feedforward Linear Power Amplifiers," Artech House, 1999, pp. 73 to 76, for instance. Moreover, the entire disclosure of this literature are incorporated herein by reference in its entity.

Figure 3:
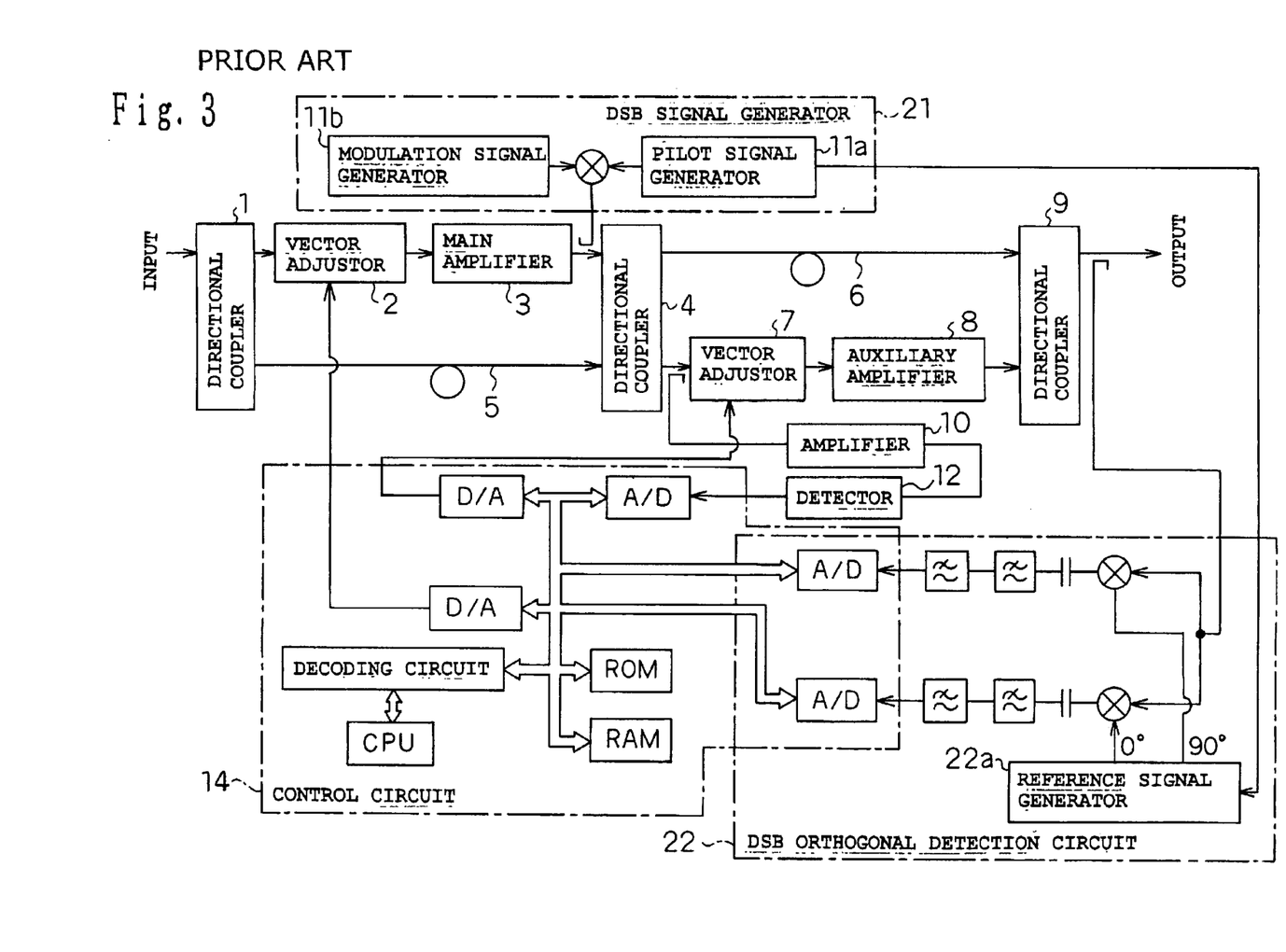
FIG. 3 is a block diagram of the feedforward amplifier of the past.

The feedforward amplifier of implementing such broad-band control is exemplified by Japanese Patent Laid-Open No. 8-56126 "Distortion Compensation Amplifier Circuit," which will be described by referring to FIG. 3. In FIG. 3, reference numeral 1 denotes a first directional coupler, 2 denotes a first vector adjustor, 3 denotes a main amplifier, 4 denotes a second directional coupler, 5 denotes a first delay element, 6 denotes a second delay element, 7 denotes a second vector adjustor, 8 denotes an auxiliary amplifier, 9 denotes a third directional coupler, 10 denotes an amplifier, 11a denotes a pilot signal generator, 11b denotes a modulation signal generator, 12 denotes a detector, 14 denotes a digital-type control circuit comprised of an A/D converter, a D/A converter, a CPU and a memory, 21 denotes a DSB signal generator comprised of the pilot signal generator 11a and modulation signal generator 11b, and 22 denotes a DSB orthogonal detection circuit comprised of a reference signal generator, an orthogonal mixer, a filter and the A/D converter.

In this configuration, a removal control circuit uses at least two oscillators of the pilot signal generator 11a and modulation signal generator 11b and mixes signals from these two oscillators while rendering the signal from the pilot signal generator 11a as a carrier signal and the signal from the modulation signal generator 11b as a modulation signal so as to generate a pilot signal to be injected into the feedforward amplifier.

In addition, a reference signal generator 22a of receiving the carrier signal directly outputted from the pilot signal generator 11a to the DSB orthogonal detection circuit 22 is used to down-convert an output signal taken out of a coupler connected between the directional coupler 9 and the output side so as to have a transmission carrier removed by a filter, and results of sampling with the A/D converter are used to output a voltage of controlling the second vector adjustor 7 so that the control circuit 14 surpresses a distortion signal of the feedforward amplifier, that is, the level of the pilot signal becomes the lowest.

While the feedforward amplifier is originally an apparatus of controlling the vector adjustor mainly based on the output signal including the pilot signal and the pilot signal taken out thereof, it is necessary to set a frequency of the pilot signal outside a frequency band of the output signal and so the distortion signal cannot be sufficiently suppressed.

The feedforward amplifier of the above past example generates the pilot signal from the signals of the two oscillators of the pilot signal generator 11a and modulation signal generator 11b, and detects the output signal with the signal of the pilot signal generator 11a. Thus, it is possible to set the frequency of the pilot signal within the frequency band of the output signal so as to suppress the distortion signal under an optimum condition.

In the above configuration, however, there are a large number of the oscillators used to detect generation of the pilot signals, and at least the DSB signal generator 21 needs the pilot signal generator 11a and modulation signal generator 11b. As the oscillators are not small enough to be integrated on an integrated circuit together with other components, they need to have a separate configuration from other circuit components that can be integraded on an intergrade circuit, and this has hindered miniaturization of the feedforward amplifier.

Furthermore, a plurality of oscillators need to be mutually placed with certain spacing in order to secure isolation, and this has further hindered the miniaturization of the feedforward amplifier.

SUMMARY OF THE INVENTION

The present invention has been implemented in consideration of the above problems, and an object thereof is to obtain the feedforward amplifier and so on capable of further being miniaturized by reducing the number of the oscillators while suppressing the distortion signal under the optimum condition.

One aspect of the present invention is a feedforward amplifier having:

amplifying means of amplifying an input signal to obtain an amplified signal;

pilot signal generating means, having one local oscillator and a frequency divider for dividing output of said local oscillator, of generating a predetermined pilot signal based on the output of said local oscillator and the output of said frequency divider;

combining means of combining said input signal or said amplification signal with said pilot signal to generate a combined signal;

extracting means of extracting any distortion component from said combined signal;

output signal generating means of removing said extracted distortion component from said combined signal to generate an output signal; and adjusting means of using any one of the output of said local oscillator, the output of said frequency divider, said pilot signal and said output signal from said output signal generating means to make an adjustment for removing said distortion component.

Another aspect of the present invention is the feedforward amplifier, wherein said pilot signal generating means has modulating means of having the output of said local oscillator modulated by the output of said frequency divider, a frequency of the output of said local oscillator is within a frequency band of the output signal from said output signal generating means, and a frequency of the output of said frequency divider is outside the frequency band of the output signal from said output signal generating means.

Still another aspect of the present invention is the feedforward amplifier, wherein said pilot signal generating means has a first mixer of mixing the output of said local oscillator and the output of said frequency divider, and the frequency of the output of said local oscillator is within a frequency band of the output signal from said output signal generating means, and the frequency of the output of said frequency divider is outside the frequency band of the output signal from said output signal generating means.

Yet still another aspect of the present invention is the feedforward amplifier, wherein said adjusting means performs said adjustment by using said pilot signal and said output signal.

Still yet another aspect of the present invention is the feedforward amplifier, wherein said adjusting means has a first converting means of converting said output signal into a low frequency band which is lower than the original frequency band and a second converting means of converting said pilot signal into a low frequency band which is lower than the original frequency band, and performs said adjustment by using the pilot signal converted into said low frequency band and the output signal converted into said low frequency band.

A further aspect of the present invention is the feedforward amplifier, wherein said first converting means has said local oscillator and a second mixer of combining the output from said local oscillator and said output signal, and said second converting means has said frequency divider and uses the output from said frequency divider as said converted pilot signal.

A still further aspect of the present invention is the feedforward amplifier, wherein said first converting means at least one of a first filter of receiving input of said output signal has provided on a front stage of said second mixer and a second filter of receiving input of said second mixer.

A yet further aspect of the present invention is the feedforward amplifier, wherein said first filter is a band pass filter.

A still yet further aspect of the present invention is the feedforward amplifier, wherein said first filter is a band rejection filter.

An additional aspect of the present invention is the feedforward amplifier, wherein said first filter is a band pass filter of having at least two frequencies pass through it.

A still additional aspect of the present invention is the feedforward amplifier, wherein said second filter is a band pass filter.

A yet additional aspect of the present invention is the feedforward amplifier, wherein said second filter is a low pass filter.

A still yet additional aspect of the present invention is the feedforward amplifier, wherein said second filter is a band rejection filter.

A supplementary aspect of the present invention is the feedforward amplifier, wherein a dividing ratio of said frequency divider is a fraction.

A still supplementary aspect of the present invention is the feedforward amplifier, wherein a dividing ratio of said frequency divider is variable.

A yet supplementary aspect of the present invention is the feedforward amplifier, wherein:

said extracting means has a first branching means of branching said input signal into two to output one of them to said amplifying means and a first opposite phase combining means of receiving the other output of said first branching means and the input of said combined signal and branching said combined signal into two so as to output as said distortion component a signal in which one of branched said combined signal and the other output of said first branching means are combined in an opposite phase and also output the other of said combined signal as—is;

said output signal generating means has a second opposite phase combining means of outputting as said output signal a component in which said distortion component from said first opposite phase combining means and the other of said combined signal are combined in the opposite phase.

A still yet supplementary aspect of the present invention is the feedforward amplifier, wherein said output signal generating means has:

vector adjusting means, provided between said first opposite phase combining means and said second opposite phase combining means, of adjusting an amplitude and a phase of said distortion component; and distortion component amplifying means, provided between said vector adjusting means and said second opposite phase combining means, of amplifying the output of said vector adjusting means.

Another aspect of the present invention is the feedforward amplifier, wherein at least two of said local oscillator, said frequency divider, said first mixer, said second mixer, said first filter, said second filter and said adjusting means are integrated in the same semiconductor substrate.

Still another aspect of the present invention is a feedforward amplification method having the steps of:

amplifying an input signal to obtain an amplified signal; dividing output of one local oscillator and generating a pilot signal based on the output of said local oscillator and said divided output;

combining said input signal or said amplification signal with said pilot signal to generate a combined signal; extracting any distortion component from said combined signal;

removing said extracted distortion component from said combined signal to generate an output signal;

using any one of the output of said local oscillator, the output of said frequency divider, said pilot signal and said output signal to perform an adjustment for removing said distortion component.

Yet still another aspect of the present invention is a communication apparatus having a feedforward amplifier, transmitting means of performing transmission and receiving means of performing reception.

The present invention as described above uses the local oscillator and the frequency divider to generate the pilot signals, and generates them by mixing them with the mixer so that the number of the oscillators can be reduced and miniaturization of the feedforward amplifier can be implemented.

DESCRIPTION OF SYMBOLS

IN input terminal
CPL1 first coupler
VAP1 first vector adjustor
AMP1 main amplifier
DLY1 first delay element
CPL2 second coupler
DLY2 second delay element
VAP2 second vector adjustor
AMP2 error amplifier
CPL3 third coupler
CPL4 fourth coupler
CPL5 fifth coupler
CPL6 sixth coupler
CPL7 seventh coupler
CNT1 distortion detection loop control circuit
OSC1 local oscillator
PRS1 frequency divider
MIX1 first mixer
MIX2 second mixer
FIL1 first filter
FIL2 second filter
CNT2, CNT2' distortion cancellation loop control circuits
OUT output terminal

PREFERRED EMBODIMENTS OF THE INVENTION

Hereafter, embodiments of the present invention will be described by referring to the drawings.

(Embodiment 1)

Figure 1:
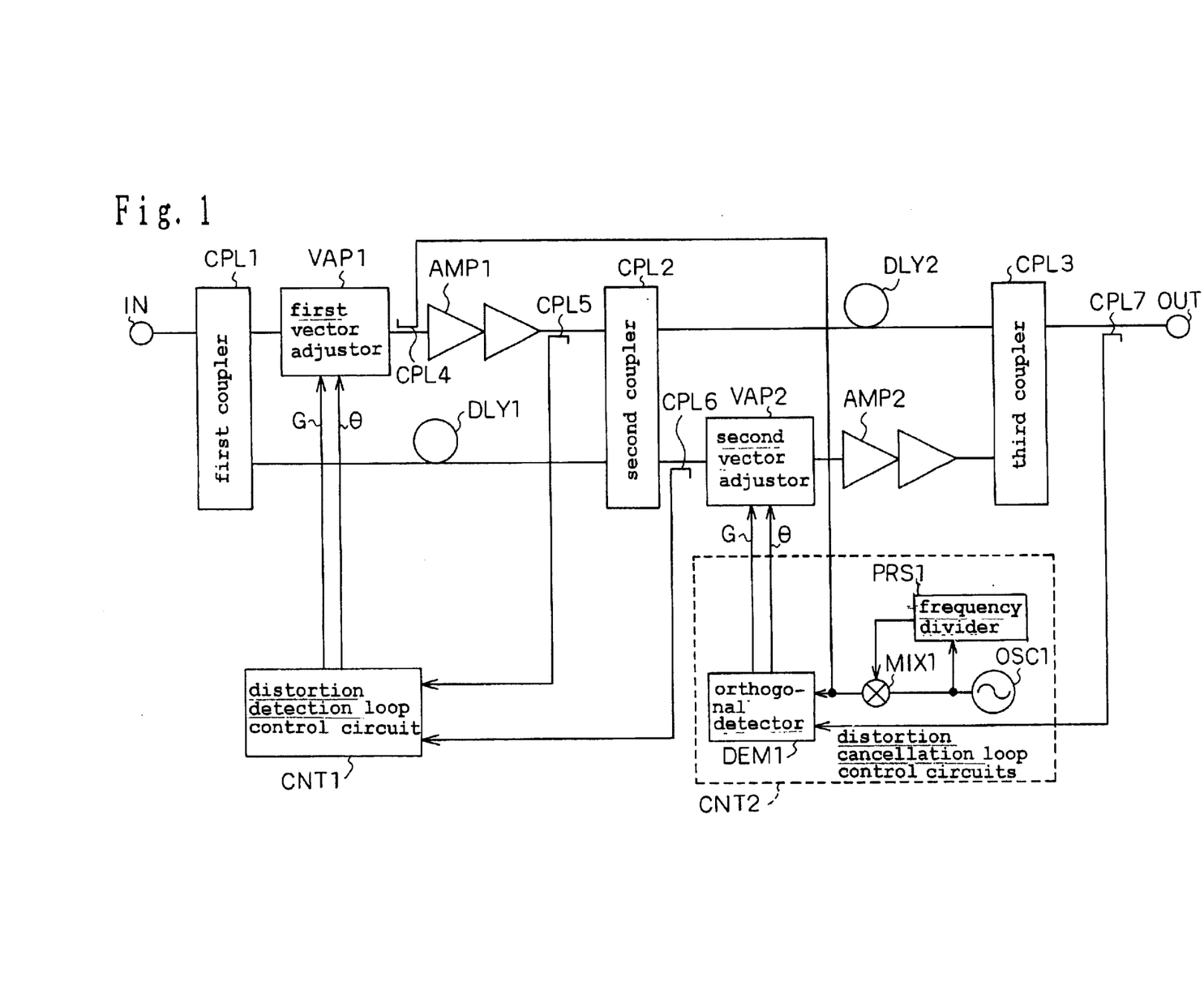
FIG. 1 is a block diagram of a feedforward amplifier of an embodiment 1 of the present invention.

Hereafter, a feedforward amplifier of an embodiment 1 of the present invention will be described by referring to the drawings, and one embodiment of a feedforward amplification method of the present invention will thereby be described. In FIG. 1, reference symbol IN represents an input terminal of receiving input of an input signal (hereafter, also referred to as a transmission carrier), CPL1 represents a first coupler, VAP1 represents a first vector adjustor, AMP1 represents a main amplifier, DLY1 represents a first delay element, CPL2 represents a second coupler, DLY2 represents a second delay element, VAP2 represents a second vector adjustor, AMP2 represents an error amplifier, CPL3 represents a third coupler, CPL4 represents a fourth coupler, CPL5 represents a fifth coupler, CPL6 represents a sixth coupler, CPL7 represents a seventh coupler, OSC1 represents a local oscillator, PRS1 represents a frequency divider, MIX1 represents a mixer, DEM1 represents an orthogonal detector, CNT1 represents an analog-type distortion detection loop control circuit, CNT2 represents distortion cancellation loop control circuit including the local oscillator OSC1 to the orthogonal detector DEM1, and OUT represents an output terminal of outputting an output signal.

The distortion detection loop control circuit CNT1 outputs an amplitude error and a phase error between the main amplifier AMP1 and the first delay element DLY1 from a difference in characteristics between the transmission carrier taken out of combined output of the fifth coupler CPL5 and that taken out of the sixth coupler CPL6 and suppressed by the distortion detection loop. The outputted amplitude error and phase error are fed back to the first vector adjustor VAP1, which exerts control so as to maintain a carrier suppressing characteristic of the distortion detection loop.

On the other hand, the distortion cancellation loop control circuit CNT2 branches a signal (a signal of 2140 MHz frequency for instance) generated by the local oscillator OSC1, and divides one of the branched component with the frequency divider PRS1 to obtain a divided output (in the case of a 32-frequency divider for instance, the frequency of divided output is 66.875 MHz), which is mixed with the other output (2140 MHz) branched by the local oscillator OSC1 with the mixer MIX1 so as to obtain a pilot signal.

The generated pilot signal is outputted as a side band of 2140±66.875 MHz, and a portion of the pilot signal is branched to be combined with the output signal from the fourth coupler CPL4 and inputted to the main amplifier AMP1, and the remaining pilot signal and the output signal taken out of the seventh coupler CPL7 are inputted to the orthogonal detector DEM1 Here, the frequencies of the output signal and the pilot signal are substantially the same. In addition, while the frequency of the signal of the local oscillator OSC1 which is the origin of the pilot signal is within the frequency band of the output signal, the frequency of the divided output is outside the frequency band thereof.

The amplitude error and phase error of the error amplifier AMP2 and the second delay element DLY2 are outputted from a difference in characteristics between the pilot signal and the output signal, and they are fed back to the second vector adjustor VAP2 so as to exerts control to maintain a distortion suppressing characteristic of the distortion cancellation loop. To be more specific, the orthogonal detector DEM1 detects the output signal with the pilot signal, and takes out a component in the output signal of the same frequency as the pilot signal (side band of 2140±66.875 MHz) as a DC component so as to make an adjustment to minimize the level of this DC component.

Thus, according to the present invention, it is possible, by having a configuration wherein the frequency divider PRS1 and the mixer MIX1 are used to obtain the pilot signal from one local oscillator OSC1, to reduce the number of the oscillators used for the distortion cancellation loop control circuit compared with the apparatus in the past while suppressing the distortion signal under the optimum condition. As the frequency divider PRS1 and the mixer MIX1 can be provided on an integrated circuit just as circuit components such as the coupler CPL1 and error amplifier AMP2, it is possible to implement miniaturization of the feedforward amplifier.

(Embodiment 2)

Figure 2:
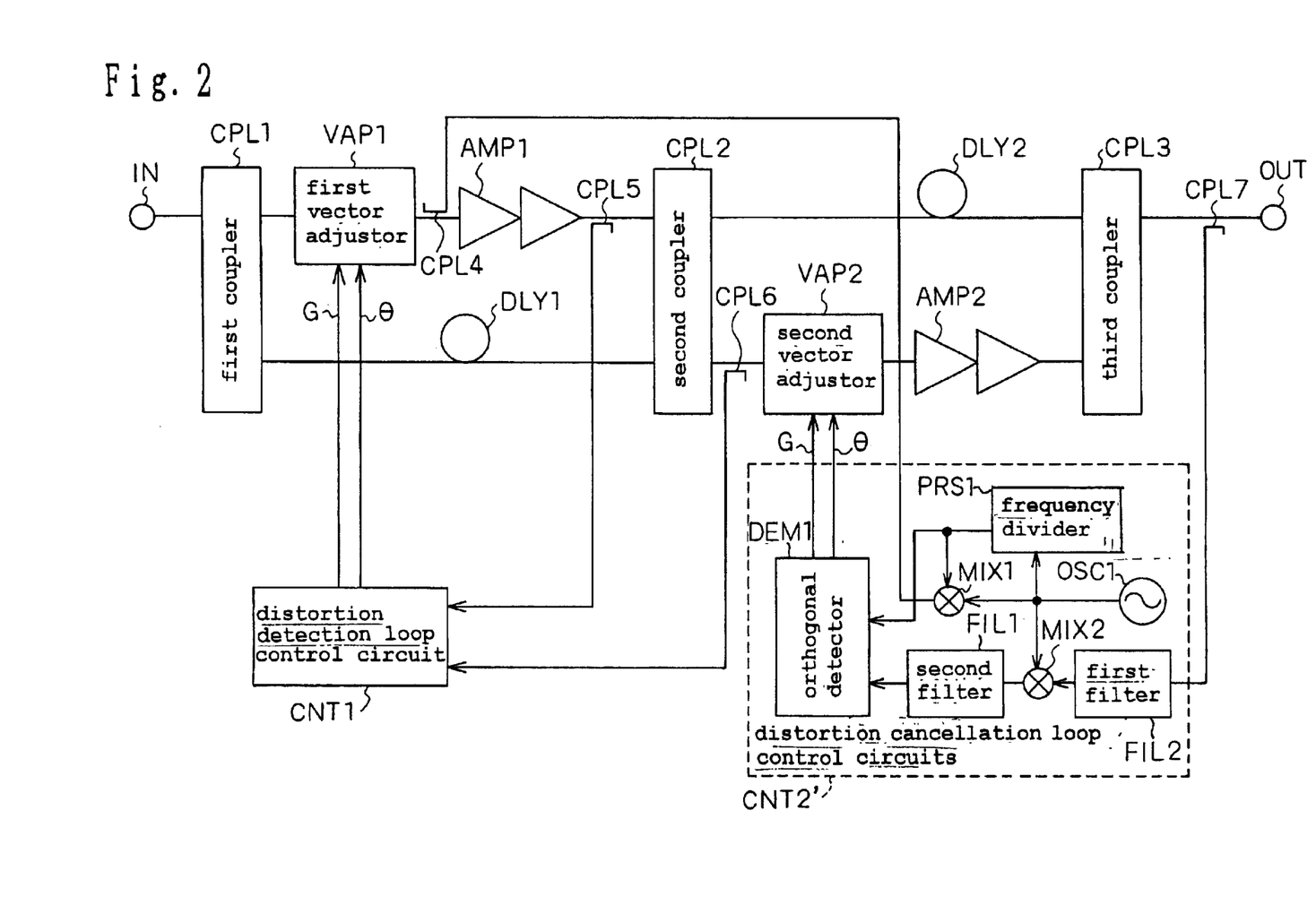
FIG. 2 is a block diagram of the feedforward amplifier of an embodiment 2 of the present invention.

Next, the feedforward amplifier of an embodiment 2 of the present invention will be described by using FIG. 2. The portions in FIG. 2 duplicated in FIG. 1 are given the same symbols, and description thereof will be omitted. In addition, in a distortion cancellation loop control circuit CNT2', reference symbol FIL1 represents a first filter, MIX2 represents a second mixer, and FIL2 represents a second filter.

Operation of the feedforward amplifier of the embodiment 2 having such a configuration will be described. However, the same portions as the embodiment 1 are omitted, and differences are mainly described.

As in the embodiment 1, the distortion detection loop control circuit CNT1 outputs the amplitude error and phase error between the main amplifier AMP1 and the first delay element DLY1 from the difference in characteristics between the transmission carrier taken out of combined output of the fifth coupler CPL5 and that taken out of the sixth coupler CPL6 and suppressed by the distortion detection loop. The amplitude error and phase error are fed back, and the first vector adjustor VAP1 exerts control so as to maintain the carrier suppressing characteristic of the distortion detection loop.

On the other hand, the distortion cancellation loop control circuit CNT2' branches into three the signal (2140 MHz for instance) generated by the local oscillator OSC1.

Of the signal branched into three, one is divided by the frequency divider PRS1 and is generated as the divided output (in the case of a 32-frequency divider for instance, the frequency is 66.875 MHz).

The divided output is further branched into two, and one of them is mixed with one of the remaining two of the signal branched into three of the output (2140 MHz) of the local oscillator OSC1 by the mixer MIX1, and is outputted to the fourth coupler CPL4 as the pilot signal having the side band of 2140±66.875 MHz.

Next, the pilot signal (2140±66.875 MHz) taken out of the seventh coupler CPL7 together with the output signal has its transmission carrier component partly removed via the first filter FIL1.

The signal having the transmission carrier component partly removed and the remaining one of the signal branched into three of the local oscillator OSC1 are inputted to the second mixer MIX2 so that the signal having a difference frequency (66.875 MHz) is generated. The signal having the difference frequency has the remainder of the transmission carrier component further removed via the second filter FIL2.

The signal having the remainder of the transmission carrier component further removed is inputted to the orthogonal detector DEM1 as a down-converted output signal and the remaining one of the output (66.875 MHz) branched into two of the frequency divider PRS1 are inputted thereto likewise as a down-converted pilot signal. Moreover, the frequencies of the down-converted output signal and the down-converted pilot signal are substantially the same.

The orthogonal detector DEM1 outputs the amplitude error and phase error of the error amplifier AMP2 and the second delay element DLY2 from the difference in the respective inputted signal characteristics, and feeds them back to the second vector adjustor VAP2 so as to exert control to maintain the distortion suppressing characteristic of the distortion cancellation loop. To be more specific, the orthogonal detector DEM1 detects the output signal with the pilot signal, and takes out as a DC component the component which is in the output signal and of the same frequency as the pilot signal (side band of 2140±66.875 MHz) so as to make an adjustment to minimize the level of this DC component.

Thus, according to this embodiment, it is possible, by having the configuration wherein the frequency divider PRS1 and the mixer MIX1 are used to obtain the pilot signal from one local oscillator OSC1, to reduce the number of the oscillators used for the distortion cancellation loop control circuit compared with the apparatus in the past while suppressing the distortion signal under the optimum condition. As the frequency divider PRS1 and the mixer MIX1 can be provided on an integrated circuit just as circuit components such as the coupler CPL1 and error amplifier AMP2, it is possible to implement miniaturization of the feedforward amplifier.

Further according to this embodiment, in the distortion cancellation loop control circuit CNT2' the output signal inputted from the seventh coupler CPL7 passes through the first filter FIL1 and further passes through the second filter FIL2 after down-converted by the mixer MIX2, and also the signal of the local oscillator OSC1 is divided by the frequency divider PRS1 to down-convert the pilot signal so as to operate the orthogonal detector DEM1 based on the two down-converted signals. Thus, a dynamic range of the orthogonal detector DEM1 can be rendered smaller than that in the embodiment 1 so that a lower-cost orthogonal detector may be used and consequently a lower-cost feedforward amplifier can be obtained.

Moreover, while the first filter FIL1 and the second filter FIL2 are used to remove the transmission carrier in the embodiment 2, these filters may be any of a band pass filter, a band rejection filter and a low pass filter as far as they are filters capable of removing the transmission carrier from the output signal only through the pilot signal. In addition, in the case where the transmission carrier is sufficiently removed, the same effect can be obtained without these filters, and so it may have a configuration wherein both or any one of the first filter FIL1 and the second filter FIL2 are omitted.

Moreover, in the above embodiment 1, the first coupler CPL1 corresponds to first branching means of the present invention and the second coupler CPL2 corresponds to first opposite phase combining means thereof, and these portions constitute extracting means of the present invention.

In addition, the third coupler CPL3 corresponds to second opposite phase combining means of the present invention, the vector adjustor VAP2 corresponds to vector adjusting means thereof, and the error amplifier AMP2 corresponds to distortion component amplifying means thereof, and these portions constitute output signal generating means of the present invention.

In addition, the local oscillator OSC1 in the distortion cancellation loop control circuit CNT2 corresponds to the local oscillator of the present invention, the frequency divider PRS1 corresponds to the frequency divider thereof, the mixer MIX1 corresponds to the first mixer thereof, and these portions constitute pilot signal generating means of the present invention.

In addition, the main amplifier AMP1 corresponds to amplifying means of the present invention.

In addition, the fourth coupler CPL4 corresponds to combining means of the present invention, and the orthogonal detector DEM1 corresponds to adjusting means thereof.

In addition, the local oscillator OSC1 corresponds to the local oscillator of first converting means of the present invention, the mixer MIX2 corresponds to the second mixer of second converting means thereof, the frequency divider PRS1 corresponds to the frequency divider of second converting means thereof, and the first filter FIL1 and the second filter FIL2 correspond to the first filter and the second filter of the first converting means thereof.

Accordingly, while it may have a configuration wherein the vector adjustor VAP1, fifth coupler CPL5, sixth coupler CPL6, distortion detection loop control circuit CNT1, delay element DLY1, delay element DLY2 and error amplifier AMP2 are totally or partly omitted, or a configuration wherein the distortion component amplifying means is further omitted, it should desirably have the configuration wherein the portions conforming to the above embodiment are provided so that it operates adequately as the feedforward amplifier.

In addition, while the distortion detection loop control circuit CNT1 was described as the analog type in the above embodiments 1 and 2, it may also be implemented as a digital type having a CPU and a detector just as a control circuit 14 in the past example. In this case, it is possible to control the first vector adjustor VAP1 only with the combined output from the sixth coupler CPL6. Accordingly, the feedforward amplifier of the present invention may also be implemented as a configuration wherein the fifth coupler CPL5 is omitted.

In addition, while a description was given as to the above embodiments that the orthogonal detector DEM1 operates by receiving the input of the pilot signal and output signal of substantially the same frequency, the control means of the present invention may exert control to maintain the carrier suppressing characteristic by receiving the input of the signals of mutually different frequencies. For instance, it may operate based on the output from the local oscillator OSC1 instead of the pilot signal and output signal or based on the output and output signal from the frequency divider PRS1.

In addition, while a description was given as to the above embodiments that the pilot signal is obtained by mixing the output from the local oscillator OSC1 and that from the frequency divider PRS1 with the first mixer, modulating means other than the mixer may also be used because, according to the present invention, it is sufficient to modulate the output of the local oscillator having the frequency within the frequency band of the output signal to the output of the frequency divider having the frequency outside the frequency band of the output signal and thereby obtain the pilot signal.

In addition, while a dividing ratio of the frequency divider PRS1 is 32 in the embodiments 1 and 2, the dividing ratio may obviously be changed freely according to a desired set frequency of the pilot signal to obtain the same effect and so it does not have to be an integer as the dividing ratio. For instance, a fractional frequency divider wherein the dividing ratio is a fraction such as $5/16$ maybe used. Moreover, while an oscillation frequency of the local oscillator OSC1 is 2140 MHz, it is just an example and the same effect may obviously be obtained by selecting it according to a set frequency of a desired pilot signal in the neighborhood of the frequency band to be amplified of the feedforward amplifier.

In addition, while a dividing ratio of the frequency divider PRS1 is fixed in the embodiments 1 and 2, the same effect can be obtained by rendering the dividing ratio variable so as to be changed according to the frequency and power level of the transmission carrier.

In addition, while the fifth coupler CPL5 is between the output of the main amplifier AMP1 and the input of the second coupler CPL2 in the embodiments 1 and 2, the same effect can be obtained as far as the signal to be taken out of the fifth coupler includes the transmission carrier, irrespective of which point it is pulled out of. For instance, the same effect can obviously be obtained by taking out the transmission carrier between the output of the first delay element DLY1 and the input of the second coupler CPL2, on the input terminal of the first delay element DLY1, between the stages of or on the input terminal of the main amplifier AMP1 in the case where it is multistage, between the output of the second coupler CPL2 and the input of the delay element DLY2, between the delay elements DLY2 in the case where there are a plurality thereof, between the output of the delay element DLY2 and the input of the third coupler CPL3, or from the combined output of the seventh coupler CPL7 after outputting of the third coupler CPL3.

In addition, while the sixth coupler CPL6 is placed between the output of the second coupler CPL2 and the input of the second vector adjustor in the embodiments 1 and 2, the same effect can obviously be obtained by inserting an amplifier between the output of the second coupler CPL2 and the input of the sixth coupler CPL6 in order to increase the combined output level of the sixth coupler CPL6, or inserting an attenuator or inserting both the attenuator and amplifier between the output of the second coupler CPL2 and the input of the sixth coupler CPL6 in order to curb a reflected power from the sixth coupler CPL6 to the second coupler CPL2 and prevent a standing wave.

In addition, the same effect can also be obtained by rendering the distortion cancellation loop control circuit CNT2 shown in the embodiments 1 and 2 as an IC wherein at least two of constituent circuit elements are placed in the same integrated semiconductor substrate, and it can thereby be further miniaturized.

In addition, it becomes possible, by using the feedforward amplifier of the present invention on a communication apparatus having transmitting means of performing transmission and receiving means of performing reception, to implement a miniaturized base station apparatus in the case of using it on a base station of mobile communication equipment.

As described above, the feedforward amplifier of the present invention can reduce the number of the required oscillators while suppressing the distortion signal under the optimum condition so that the miniaturization of the feedforward amplifier can be implemented.

What is claimed is:

1. A feedforward amplifier having:

amplifying means of amplifying an input signal to obtain an amplified signal;

pilot signal generating means including a local oscillator, a frequency divider, and a mixer, an output of said local oscillator being provided to said frequency divider and said mixer, an output of said frequency divider being provided to said mixer, said mixer generating a pilot signal;

combining means of combining at least one of said input signal of said amplifying means and said output signal from said amplifying means with said pilot signal to generate a combined signal;

extracting means of extracting any distortion component from said combined signal;

output signal generating means of generating an output signal without the extracted distortion component; and adjusting means of using any one of the output of said local oscillator, the output of said frequency divider, said pilot signal and said output signal from said output signal generating means to make an adjustment for removing said distortion component.

2. The feedforward amplifier according to claim 1, wherein said pilot signal generating means includes modulating means of modulating the output of said local oscillator by the output of said frequency divider, a frequency of the output of said local oscillator being within a frequency band of the output signal from said output signal generating means, and a frequency of the output of said frequency divider being outside the frequency band of the output signal from said output signal generating means.

3. The feedforward amplifier according to claim 1, wherein said mixer mixes the output of said local oscillator and the output of said frequency divider, the frequency of the output of said local oscillator being within a frequency band of the output signal from said output signal generating means, and the frequency of the output at said frequency divider being outside the frequency band of the output signal from said output signal generating means.

4. The feedforward amplifier according to any one of claims 1 to 3, wherein said adjusting means performs said adjustment by using said pilot signal and said output signal from said output signal generating means.

5. The feedforward amplifier according to claim 4, wherein said adjusting means includes a first converting means of converting said output signal from said output signal generating means into a low frequency band which is lower than the original frequency band and a second converting means of converting said pilot signal into a low frequency band which is lower than the original frequency band, and performs said adjustment by using the pilot signal converted into said low frequency band and the output signal from said output signal generating means converted into said low frequency band.

6. The feedforward amplifier according to claim 5, wherein said first converting means includes said local oscillator and a second mixer of combining the output from said local oscillator and said output signal from said output signal generating means, said second converting means including said frequency divider and using the output from said frequency divider as said converted pilot signal.

7. The feedforward amplifier according to claim 6, wherein said first converting means includes at least one of a first filter of receiving input of said output signal provided on a front stage of said second mixer, and a second filter of receiving input of said second mixer.

8. The feedforward amplifier according to claim 7, wherein said first filter is a band pass filter.

9. The feedforward amplifier according to claim 7, wherein said first filter is a band rejection filter.

10. The feedforward amplifier according to claim 7, wherein said first filter is a band pass filter configured for passing at least two frequencies.

11. The feedforward amplifier according to claim 7, wherein said second filter is a band pass filter.

12. The feedforward amplifier according to claim 7, wherein said second filter is a low pass filter.

13. The feedforward amplifier according to claim 7, wherein said second filter is a band rejection filter.

14. The feedforward amplifier according to claim 1, wherein a dividing ratio of said frequency divider is a fraction.

15. The feedforward amplifier according to claim 1, wherein a dividing ratio of said frequency divider is variable.

16. The feedforward amplifier according to claim 2 or 3, wherein:
said extracting means includes a first branching means of branching said input signal into two signals, one of the two signals being transmitted to said amplifying means, said extracting means also including a first opposite phase combining means of receiving the other of the two signals from said first branching means and the input of said combined signal, said first opposite phase combining means branching said combined signal into two signals so as to output as said distortion component a signal in which one of the branched signals of said combined signal and the other of the two signals from said first branching means are combined in an opposite phase, said opposite phase combining means outputting the other of the branched signals of said combined signal as-is;
said output signal generating means including a second opposite phase combining means of outputting, as said output signal, a component in which said distortion component from said first opposite phase combining means and the other of the branched signals of said combined signal are combined in the opposite phase.

17. The feedforward amplifier according to claim 16, wherein said output signal generating means has:
vector adjusting means, provided between said first opposite phase combining means and said second opposite phase combining means, of adjusting an amplitude and a phase of said distortion component; and
distortion component amplifying means, provided between said vector adjusting means and said second opposite phase combining means, of amplifying the output of said vector adjusting means.

18. The feedforward amplifier according to claim 7, wherein at least two of said local oscillator, said frequency divider, said first mixer, said second mixer, said first filter, said second filter and said adjusting means are integrated in the same semiconductor substrate.

19. A feedforward amplification method having the steps of:
amplifying an input signal to obtain an amplified signal;
dividing output of one local oscillator and generating a pilot signal based on the output of said local oscillator and said divided output;
combining at least one of said input signal and said amplified signal with said pilot signal to generate a combined signal;
extracting any distortion component from said combined signal;
generating an output signal without the distortion component; and
adjusting for the removal of the distortion component using any one of the output of said local oscillator, the output of said frequency divider, said pilot signal and said output signal.

20. A communication apparatus comprising:
a feedforward amplifier having:
amplifying means of amplifying an input signal to obtain an amplified signal,
pilot signal generating means including a local oscillator, a frequency divider, and a mixer, an output of said local oscillator being provided to said frequency divider and said mixer, an output of said frequency divider being provided to said mixer, said mixer generating a pilot signal,
combining means of combining at least one of said input signal of said amplifying means and said output signal from said amplifying means with said pilot signal to generate a combined signal,
extracting means of extracting any distortion component from said combined signal,
output signal generating means of generating an output signal without the extracted distortion component, and
adjusting means of using any one of the output of said local oscillator, the output of said frequency divider, said pilot signal and said output signal from said output signal generating means to make an adjustment for removing said distortion component:
transmitting means of performing transmission of signals from said feedforward amplifier; and
receiving means of performing reception of signals for transmission to said feedforward amplifier.

21. The feedforward amplifier of claim 1 wherein said combining means combines a direct Input signal of said amplifying means or a direct output signal from said amplifying means with said pilot signal to generate said combined signal.

* * * * *

UNITED STATES PATENT AND TRADEMARK OFFICE
CERTIFICATE OF CORRECTION

PATENT NO. : 6,734,727 B2
DATED : May 11, 2004
INVENTOR(S) : Karou Ishida et al.

It is certified that error appears in the above-identified patent and that said Letters Patent is hereby corrected as shown below:

Column 12,
Line 62, change "Input" to -- input --.

Signed and Sealed this

Twenty-first Day of December, 2004

JON W. DUDAS
*Director of the United States Patent and Trademark Office*